(12) United States Patent
Yun

(10) Patent No.: US 7,785,918 B2
(45) Date of Patent: Aug. 31, 2010

(54) IMAGE DEVICE AND METHOD OF MANUFACTURING THE SAME

(75) Inventor: Young-Je Yun, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 331 days.

(21) Appl. No.: 11/775,621

(22) Filed: Jul. 10, 2007

(65) Prior Publication Data
US 2008/0068476 A1   Mar. 20, 2008

(30) Foreign Application Priority Data
Jul. 12, 2006   (KR) .................. 10-2006-0065396

(51) Int. Cl.
*H01L 21/00* (2006.01)
*H01L 31/062* (2006.01)
(52) U.S. Cl. .............. 438/70; 438/69; 438/57; 438/60; 438/75; 438/73; 257/294; 257/432; 257/E21.121; 257/E31.127; 250/226
(58) Field of Classification Search .......... 257/294, 257/E21.121, 432, E31.127; 438/74, 70, 438/69
See application file for complete search history.

(56) References Cited

U.S. PATENT DOCUMENTS

| | | | | |
|---|---|---|---|---|
| 5,994,721 A * | 11/1999 | Zhong et al. | ................... | 257/89 |
| 6,200,479 B1 * | 3/2001 | Zampini et al. | ............. | 210/660 |
| 2006/0138500 A1 * | 6/2006 | Kim | ........................... | 257/294 |
| 2007/0026564 A1 * | 2/2007 | Wu et al. | ...................... | 438/69 |

* cited by examiner

*Primary Examiner*—Ha Tran T Nguyen
*Assistant Examiner*—Aaron A Dehne
(74) *Attorney, Agent, or Firm*—Sherr & Vaughn, PLLC

(57) ABSTRACT

An image device which includes reflowed color filters. Reflowed color filters may be formed by heat treating preliminary color filters. When preliminary color filters are reflowed, color filters of different colors may be formed continuous with each other. Contiguous color filters in an image device may reduce manufacturing costs, maximize optical efficiency, minimize noise, and/or minimize crosstalk.

16 Claims, 4 Drawing Sheets

IMAGE DEVICE AND METHOD OF MANUFACTURING THE SAME

The present application claims priority under 35 U.S.C. 119 to Korean Patent Application No. 10-2006-0065396 (filed on Jul. 12, 2006), which is hereby incorporated by reference in its entirety.

BACKGROUND

Semiconductor image devices that convert images into electrical signals have been developed. Types of image devices include Charge Coupled Devices (CCD) and CMOS image devices. A CCD device includes a plurality of MOS capacitors, where each MOS capacitor may operate by moving carriers generated by light. A CMOS image device may includes a plurality of unit pixels and a CMOS logic circuit controlling output signals of the unit pixel.

Figure 1:
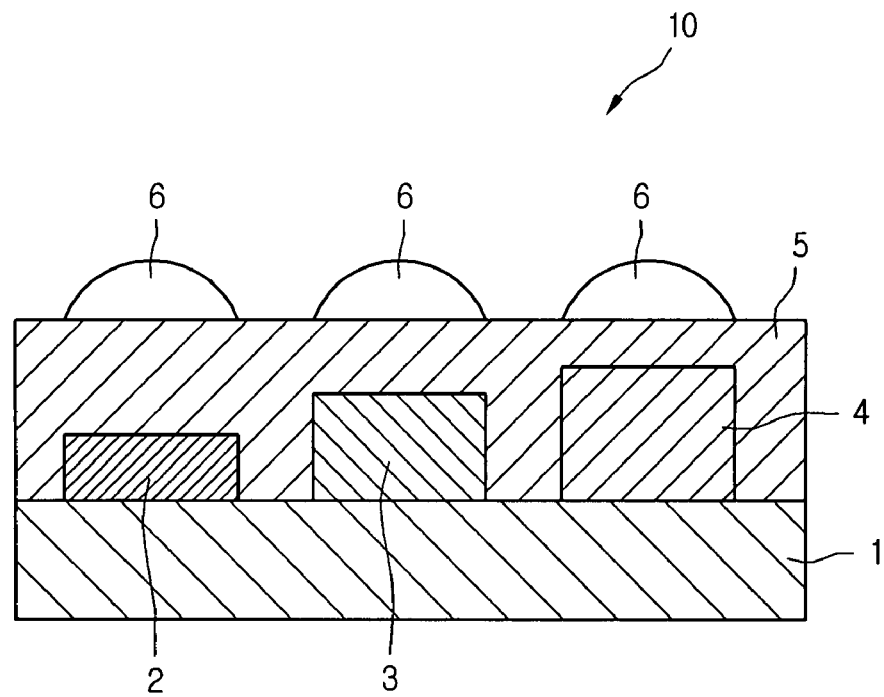

As illustrated in example FIG. 1, a CMOS image sensor 10 may include a plurality of different color filters in a unit pixel (e.g. blue color filter 2, green color filter 3, and red color filter 4 in a unit pixel) which each selectively transmit different colors of light, while filtering white light. Each unit pixel may include a plurality of pixels, with each pixel including one color filter. The plurality of color filters may be formed over a semiconductor substrate 1. Planar layer 5 may be formed over the plurality of color filters to compensate for height differences between different types of color filters (e.g. the height difference between blue color filter 2 and green color filter 3 and red color filter 4). A lens 6 may be formed in each pixel over planar layer 5 to focus light through the color filter in that pixel (e.g. lens 6 may be formed over blue color filter 2 to focus light through blue color filter 2.

An active semiconductor element may be formed under each color filter in each pixel, which converts the filtered light into an electrical signal. For example, in a blue pixel an active semiconductor element may be formed below blue color filter 2 to produce an indicative electrical signal in response to blue light passing through blue color filter 2 and in a green pixel an active semiconductor element formed below green color filter 3 may produce a separate indicative electrical signal in response to green light passing through green color filter 3.

However, when the color filters are formed adjacent to each other, gaps may occur between the color filters (e.g. the gap between blue color filter 2 and green color filter 3 or the gap between green color filter 3 and red color filter 4). These gaps may cause optical problems such a cross talk and/or noise between adjacent pixels. For example, light that is directed into the gaps may be misdirected into the color filters in an uncontrollable manner. Cross talk and/or noise may degrade the quality of an image sensor by reducing an image sensor's sensitivity to light and/or reducing the resolution of an image sensor.

SUMMARY

Embodiments relate an image device that may be manufactured in a relatively simple manner, minimizes noise, and/or minimizes crosstalk. In embodiments, an image device includes at least one of the following: a first color filter melted and/or reflowed at a first temperature; a second color filter contiguous to the first color filter being melted and/or reflowed at a second temperature; a pixel array substrate supporting the first to third color filters; and micro lenses formed on and/or over the first and second color filters.

In embodiments, a method for manufacturing an image device includes at least one of: forming a first color filter melted and/or reflowed at a first temperature on and/or over a pixel array substrate; forming a second color filter melted and/or reflowed at a second temperature contiguous with the first color filter; and forming micro lenses on and/or over the first to third color filters.

DRAWINGS

Example FIG. 1 illustrates an image device.

Figure 2:
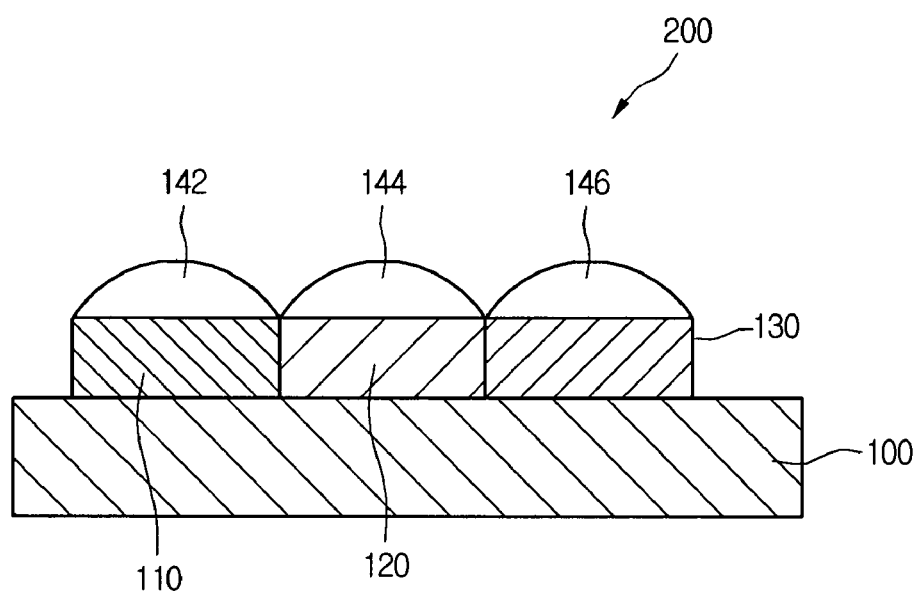

Example FIG. 2 is a sectional view illustrating an image device, in accordance with embodiments.

Figure 3:
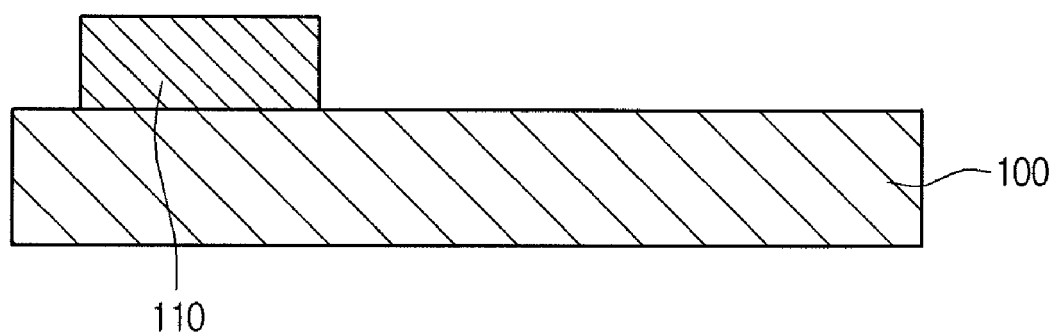

Example FIG. 3 is a sectional view illustrating the first color filter formed over a pixel array substrate, in accordance with embodiments.

Figure 4:
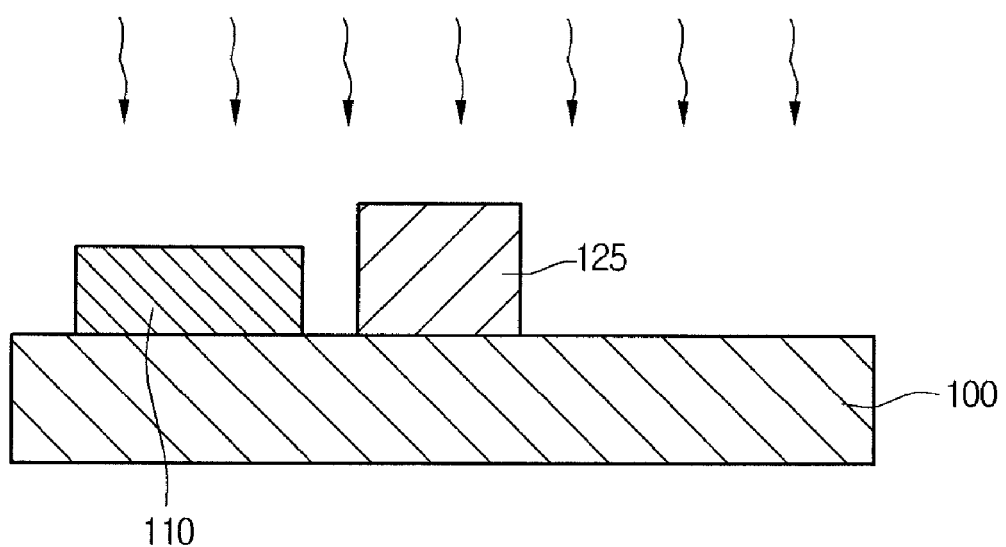

Example FIG. 4 is a sectional view illustrating a second preliminary color filter formed over a pixel array substrate, in accordance with embodiments.

Figure 5:
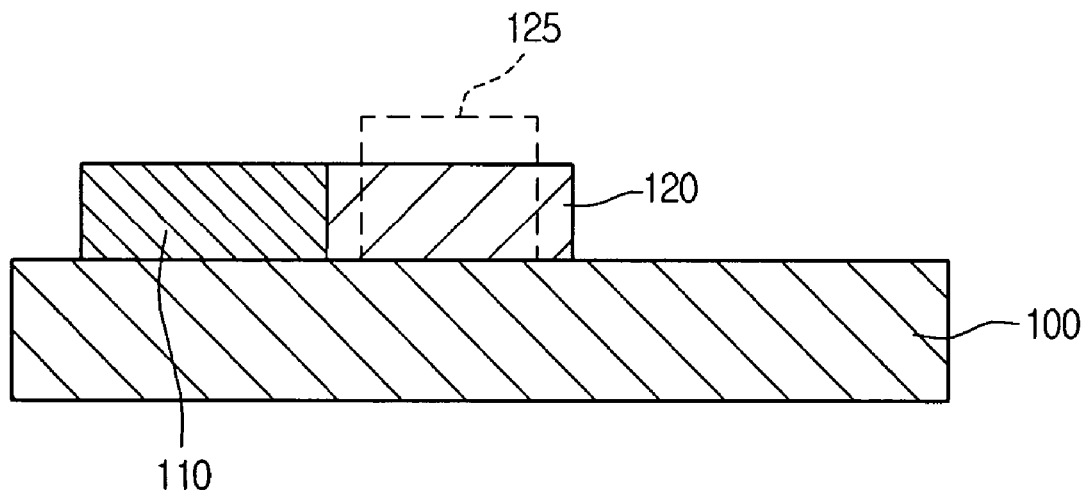

Example FIG. 5 is a sectional view illustrating a second reflowed color filter formed from the second preliminary color filter, in accordance with embodiments.

Figure 6:
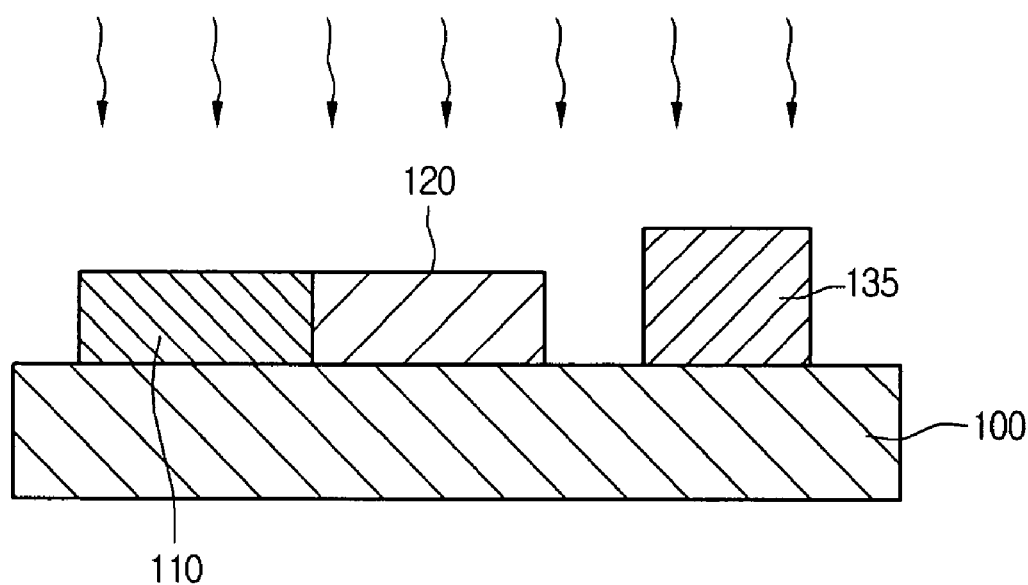

Example FIG. 6 is a sectional view illustrating a third preliminary color filter formed over a pixel array substrate, in accordance with embodiments.

Figure 7:
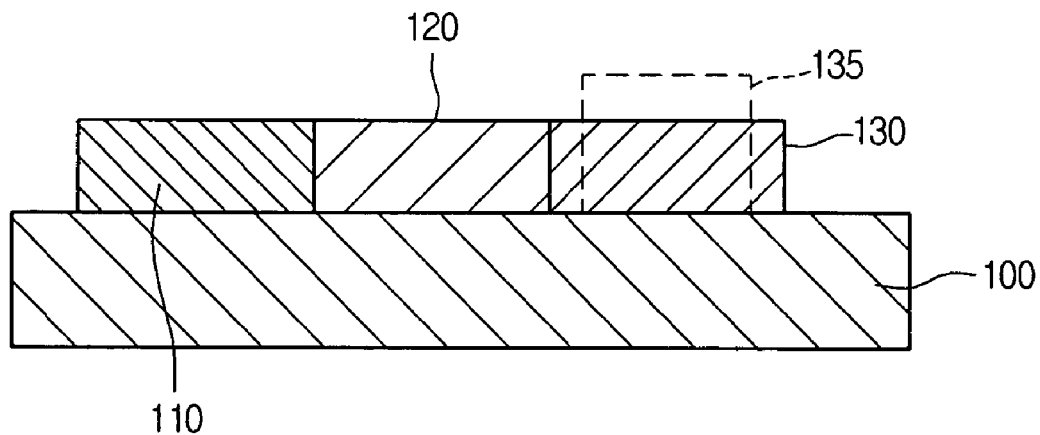

Example FIG. 7 is a sectional view illustrating a third reflowed color filter formed from the third preliminary color filter, in accordance with embodiments.

Figure 8:
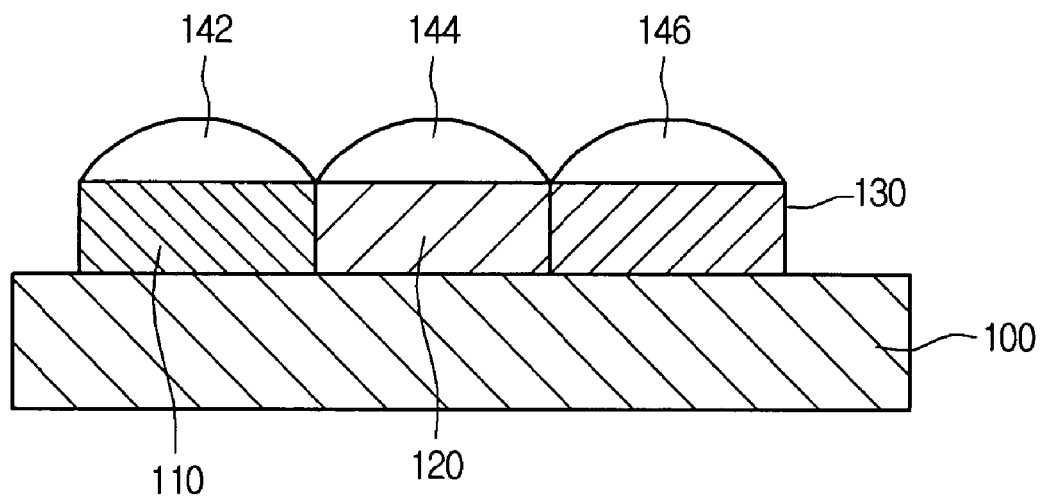

Example FIG. 8 is a sectional view illustrating first, second, and third micro lenses formed over first, second, and third color filters, in accordance with embodiments.

DESCRIPTION

Example FIG. 2 is a sectional view illustrating an image device, in accordance with embodiments. As illustrated FIG. 2, image device 200 may include pixel array substrate 100, first color filter 110, second color filter 120, third color filter 130, first micro lenses 142, second micro lenses 144, and/or third micro lenses 146. Pixel array substrate 100 may include pixels for outputting image signals according to levels of received incident light, in accordance with embodiments. Pixels may be arranged on and/or over pixel array substrate 100 in a matrix formation.

Each pixel may include a photo diode and/or at least one thin film transistor. A photo diode of a pixel may detect light incident through first color filter 110, second color filter 120, and/or third color filter 130. A transistor of a pixel may be electrically connected to a photo diode to generate image signals corresponding to the levels of charges generated by the photo diode. In embodiments, a pixel may include three to six transistors.

First color filter 110, second color filter 120, and/or third color filter 130 may be reflowed color filters. Reflowed color filters are color filters that are formed from reflowing (e.g. melting) a preliminary color filter. For example, a preliminary color filter may be formed on and/or over substrate 100. After formation of a preliminary filter, the preliminary filter may be reflowed to form a reflowed color filter. Reflowing may be performed through a temperature treatment. In embodiments, a temperature treatment may be between approximately 120° C. and approximately 140° C. However, one of ordinary skill in the art appreciates other temperature ranges. For example, a temperature treatment may be performed at a temperature less than a dye change temperature of the dye in the preliminary filter (e.g. approximately 200° C. for some dyes). By reflowing preliminary color filters, color filters may be formed that are contiguous with each other, in accordance with embodiments. In embodiments, contiguous color filter may simplify manufacturing procedures and/or maximize the performance of an imaging device.

First color filter 110 may be formed on and/or over pixel array substrate 100 as part of a pixel, in accordance with embodiments. First color filters 110 may be part of a matrix of pixels. First color filter 110, for example, may be a red color filter that allows transmission of red light. First color filter 110 may be formed from a first preliminary color filter that was reflowed (e.g. melted) by being subjected to a first temperature (e.g. approximately 120° C. to 140° C.). First color filter 110 may have a specific height.

Second color filter 120 may be formed adjacent and contiguous with first color filter 110. Second color filter 120 may be configured to filter a different color of light than first color filter 110. For example, second color filter 120 may be a green color filter that allows the transmission of green light and filters out white light. Second color filter 120 may be formed from a second preliminary color filter that was reflowed (e.g. melted) by being subjected to a second temperature (e.g. approximately 120° C. to 140° C.). In embodiments, the second temperature is less than the first temperature (e.g. reflowing temperature of the first color filter). In other embodiments, the first temperature is substantially the same as the second temperature. In embodiments, the second temperature is greater than the first temperature. In embodiments, the height of the second color filter 120 may be substantially the same as the height of the first color filter 110. In embodiments, by forming the second color filter 120 by reflowing, the first color filter 110 and the second color filter 120 may be formed contiguous to each other, which may improve the performance of an imaging device.

Third color filter 130 may adjacent and contiguous to second color filter 120 and/or first color filter 110. Third color filter 130, for example, may be a blue color filter that transmits blue light and filters white light. Although third color filter 130 is illustrated as being formed in a line with first color filter 110 and second color filter 120, third color filter may be formed with a different orientation with first color filter 110 and second color filter 120. For example, third color filter 130 may be positioned to be diagonal to either first color filter 110 or second color filter 120. Third color filter 130 may be formed from a third preliminary color filter that was reflowed (e.g. melted) by being subjected to a third temperature (e.g. approximately 120° C. to 140° C.). In embodiments, the third temperature is lower than the second temperature and/or the first temperature. In embodiments, the third temperature is substantially the same as the second temperature and/or the first temperature. In embodiments, the third temperature is greater than the second temperature and/or the first temperature. In embodiments, the height of third color filter 130 is substantially the same as first color filter 110 and/or second color filter 120.

First micro lens 142, second micro lens 144, and/or third micro lens 146 may be formed on and/or over first color filter 110, second color filter 120, and/or third color filter 130. First micro lens 142, second micro lens 144, and/or third micro lens may have hemispheric sections and may collect incident white light and direct it into first color filter 110, second color filter 120, and/or third color filter 130. First micro lens 142, second micro lens 144, and/or third micro lens 146 may be formed close to each other or contiguous to each other, which may enhance the effectiveness and efficiency of image device 200. First micro lens 142, second micro lens 144, and/or third micro lens 146 may be formed contiguous with each other because first color filter 110, second color filter 120, and/or third color filter 130 may have approximately the same thickness. First micro lens 142, second micro lens 144 and/or third micro lens 146 may be formed contiguous with each other because first micro lens 142, second micro lens 144, and/or third micro lens 146 may be formed on and/or over the first color filter 110, second color filter 120, and/or third color filter 130. Accordingly, in embodiments, light collected through first micro lens 142, second micro lens 146, and/or third micro lenses 146 may be efficiently directed to first color filter 110, second color filter 120, and/or third color filter 130 without optical loss and/or crosstalk and/or noise.

Example FIG. 3 is a sectional view illustrating first color filter 110 formed on and/or over pixel array substrate 100, in accordance with embodiments. Pixels which may generate image signals according to levels of incident light may be formed in and/or on pixel array substrate 100. Pixels may be formed in and/or on pixel array substrate 100 in a matrix configuration. Pixels may include photo diodes which may generate charges according to levels of external light. Pixels may include transistors which may generate image signals according to levels of the charges generated by a photo diode. First color filter 110 may be formed as part of a pixel formed in and/or on pixel array substrate 100.

First color filter 110 may be doped with a first color filter material (e.g. a color filter material including photosensitive material, pigments, and/or dyes), so that a first color filter layer (e.g. a preliminary color filter) is formed on and/or over pixel array substrate 100. A first color filter layer may include pigments and/or dyes that transmit red light and substantially filter white light. A first color filter material, for example, may be melted at a first temperature. A first color filter layer, for example, may be formed on and/or over pixel array substrate 100 through a spin coating process (or other similar process).

A first color filter layer formed on and/or over pixel array substrate 100 may be patterned by a photo process (e.g. a photo process including exposure and/or development processes), to form a first preliminary color filter on and/or over pixel array substrate 100. A first preliminary color filter may be reflowed through a temperature treatment to form first color filter 110. Accordingly, first color filter 110 may be a reflowed color filter. In embodiments, a temperature treatment (e.g. between approximately 120° C. and 140° C.) may be a hard bake process which hardens a first preliminary color filter into first color filter 110. In embodiments, a hard bake process may be a hard bake process that does not react to light. In embodiments, the temperature treatment causes first color filter 110 to have different material characteristics than a first preliminary filter (e.g. the melting point of first color filter 110 may be higher than first preliminary filter). In embodiments, a temperature treatment may reflow preliminary filter into first color filter, such that the height of first color filter 110 is less than first preliminary filter.

Example FIG. 4 illustrates second preliminary color filter 125 formed on and/or over pixel array substrate 100, next to first color filter 110, in accordance with embodiments. A second color filter layer (e.g. including a material having photosensitive material, pigments, and/or dyes) may be formed on and/or over pixel array substrate 100. In embodiments, second color filter layer, for example, transmits green light and filters white light. In embodiments, a second color filter layer may be formed by spin coating. In embodiments, a second color filter layer may be patterned by a photo process (e.g. including exposure and development processes) to form second preliminary color filter 125. Second preliminary color filter 125 may be spaced apart from first color filter 110 by a first interval. Second preliminary color filter 125 may have a thickness greater than first color filter 110.

In embodiments, second preliminary color filter 125 has a thickness proportional to the interval between second preliminary color filter 125 and the side of first color filter 110. For example, the larger the interval between second preliminary color filter 125 and the side of first color filter 110, the thicker second preliminary color filter 125 should be. Likewise, the smaller the interval between second preliminary color filter 125 and the side of first color filter 110, the shallower second preliminary color filter 125 should be. The thickness of second preliminary color filter 125 and spacing from first color filter 110 should be configured so that when second preliminary color filter 125 is reflowed, it will be contiguous with first color filter 110 and/or have substantially the same height as first color filter 110, in accordance with embodiments.

Example FIG. 5 illustrates second color filter 120 being reflowed from second preliminary color filter 125 through a temperature treatment, in accordance with embodiments. Second preliminary color filter 125 may be melted at a second temperature (e.g. between approximately 120° C. and 140° C.), in accordance with embodiments. In embodiments, the second temperature may be less than the first temperature that was used to form first color filter 110. In embodiments, the second temperature does not need to be less than the first temperature, since first color filter 110 was already reflowed, the melting temperature of first color filter may be greater than the melting temperature of second preliminary color filter 125. In embodiments, the second temperature may be greater or substantially the same as the first temperature. The second temperature may be lower than the dye change temperature of materials in the second preliminary color filter 125, to avoid degradation of optical characteristics of second color filter 120. Although second preliminary color filter 125 may be reflowed by the second temperature, the first color filter 110 may not be melted again or substantially effected because first color filter 110 may have a melting point higher than the second temperature.

When second preliminary color filter 125 is heated at the second temperature, second preliminary color filter 125 may be in a quasi-fluid phase, in accordance with embodiments. As second preliminary color filter 125 is reflowed (e.g. in a quasi-fluid phase), it may fill the empty space between first color filter 110 and second preliminary color filter member 125, so that second color filter 120 is contiguous with first color filter 110, in accordance with embodiments. In embodiments, the thickness of second color filter 120 and first floor filter 110 may be substantially the same.

Example FIG. 6 illustrates third preliminary color filter 135 formed on and/or over pixel array substrate 100, in accordance with embodiments. After first color filter 110 and second color filter 120 are formed, a third color filter layer (e.g. including a third color filter material having photosensitive material, pigments, and/or dyes) may be formed on and/or over pixel array substrate 100. In embodiments, third color filter layer may transmit blue light and filter white light. In embodiments, third color filter layer may be formed by spin coating (or other similar process).

Third color filter layer may be patterned (e.g. by a photo process including exposure and development processes) to form third preliminary color filter 135 on and/or over pixel array substrate 100, in accordance with embodiments. Third preliminary color filter 135 may be spaced apart from first color filter 110 and/or second color filter 120 by a second interval, in accordance with embodiments. Third preliminary color filter 135 may be thicker than first color filter 110 and/or second color filter 120. In embodiments, the thickness of third preliminary color filter 135 may be proportional to the second interval between third preliminary color filter 135 and first color filter 110 and/or second color filter 120. For example, the larger the interval between third preliminary color filter 135 and the side of second color filter 120, the thicker third preliminary color filter 135 should be. Likewise, the smaller the interval between third preliminary color filter 135 and the side of second color filter 120, the shallower third preliminary color filter 135 should be. The thickness of third preliminary color filter 135 and spacing from second color filter 120 should be configured so that when third preliminary color filter 135 is reflowed, a third color filter will be contiguous with second color filter 120 (and/or first color filter) and/or have substantially the same height as second color filter 120 (and/or first color filter), in accordance with embodiments.

Third preliminary color filter 135 may be subjected to a third temperature (e.g. between approximately 120° C. to 140° C.) to reflow third preliminary color filter 135, in accordance with embodiments. In embodiments, the third temperature may be lower than the first temperature and/or the second temperature. In embodiments, the third temperature may be substantially the same or greater than the first temperature and/or the second temperature.

Example FIG. 7 illustrating third color filter 130 reflowed from third preliminary color filter 135, in accordance with embodiments. Third preliminary color filter 135 may be reflowed (e.g. melted) at the third temperature (e.g. between approximately 120° C. to 140° C.), in accordance with embodiments. Although third preliminary color filter 135 is heated at the third temperature, first color filter 110 and second color filter 120 may not be melted because first color filter 110 and the second color filter 120 have higher melting points than the third temperature.

As third preliminary color filter 135 is heated at the third temperature, third preliminary color filter 135 may be in a quasi-fluid phase, in accordance with embodiments. When third preliminary color filter 135 is in a quasi-fluid phase, it may fill the empty space between second color filter 120 and third preliminary color filter 135, in accordance with embodiments. When third preliminary color filter 135 is in a quasi-fluid phase, the thickness of third color filter 130 may be formed to be substantially the same as first color filter 110 and/or second color filter 120, in accordance with embodiments.

Example FIG. 8 illustrates first micro lens 142, second micro lens 144, and third micro lens 146 formed on and/or over first color filter 110, second color filter 120, and/or third color filter 130, in accordance with embodiments. First micro lens 142 may be formed on and/or over first color filter 110. First micro lens 142 may collects external light and efficiently and effectively direct external light to first color filter 110. Second micro lens 144 may be formed on and/or over second color filter 120. Second micro lens 144 may collects external light and efficiently and effectively direct external light to second color filter 120. Third micro lens 146 may be formed on and/or over third color filter 130. Third micro lens 146 may collects external light and efficiently and effectively direct external light to third color filter 130.

In embodiments, since first color filter 110, second color filter 120, and/or third color filter 130 have substantially the same thickness, first micro lens 142, second micro lens 144, and/or third micro lens 146 may be formed close to or contiguous to each other. In accordance with embodiments, by first micro lens 142, second micro lens 144, and/or third micro lens 146 may be formed close to or contiguous to each other, optical efficiency of an image device can be maximized. In accordance with embodiments, by first micro lens 142, second micro lens 144, and/or third micro lens 146 may be formed close to or contiguous to each other, cross-talk and/or noise may be minimized.

According to embodiments, the step difference between first color filter 110, second color filter 120, and third color filter 130 may be minimized. When first color filter 110, second color filter 120, and third color filter 130 have substantially the same height, a planar layer between color filters and lens may not be necessary, thus reducing manufacturing costs and increasing optical efficiency, in accordance with embodiments. Since gaps between color filters are avoided, interference, noise, and/or crosstalk can be minimized, in accordance with embodiments.

Although embodiments have been described for illustrative purposes, those skilled in the art will appreciate that various modifications, additions and substitutions are possible, without departing from the scope and spirit of the accompanying claims.

What is claimed is:

1. A method for manufacturing an image device, the method comprising the steps of:
    forming a first color filter melted at a first temperature on a pixel array substrate;
    after forming the first color filter, forming a second color filter melted at a second temperature in adjacent to a lateral side of the first color filter;
    after forming the second color filter, forming a third color filter melted at a third temperature in adjacent to lateral sides of the first color filter; and
    forming micro lenses formed on the first to third color filters,
    wherein the third temperature is lower than the second temperature and the second temperature is lower than the first temperature.

2. The method as claimed in claim 1, wherein the first to third temperatures correspond to 120° C. to 140° C.

3. The method as claimed in claim 1, wherein the step of forming the first color filter comprises:
    forming a first color filter layer on the pixel array substrate;
    forming a first preliminary color filter by patterning the first color filter layer; and
    hardening the first preliminary color filter.

4. A method for manufacturing an image device, the method comprising the steps of:
    forming a first color filter melted at a first temperature on a pixel array substrate;
    forming a second color filter melted at a second temperature in adjacent to a lateral side of the first color filter;
    forming a third color filter melted at a third temperature in adjacent to lateral sides of the first color filter; and
    forming micro lenses formed on the first to third color filters,
    wherein the step of forming the second color filter comprises:
    forming a second preliminary color filter spaced apart from a lateral side of the first color filter by a first interval;
    forming the second color filter by melting the second preliminary color filter at the second temperature lower than the first temperature; and
    hardening the second color filter.

5. The method as claimed in claim 4, wherein the second preliminary color filter has a height higher than that of the first color filter.

6. The method as claimed in claim 5, wherein the second preliminary color filter has a height proportional to the first interval.

7. The method as claimed in claim 1, wherein the step of forming the third color filter comprises:
    forming a third preliminary color filter spaced apart from a lateral side of the first color filter by a second interval;
    forming the third color filter by melting the third preliminary color filter at the third temperature lower than the first and second temperatures; and
    hardening the third color filter.

8. The method as claimed in claim 7, wherein the third preliminary color filter has a height higher than that of the first color filter.

9. The method as claimed in claim 8, wherein the third preliminary color filter has a height proportional to the second interval.

10. The method as claimed in claim 1, wherein heights of the first to third color filters are substantially identical to each other when measured from a surface of the pixel array substrate.

11. The method as claimed in claim 1, wherein the micro lenses formed on the first to third color filters are interconnected to each other.

12. A method for manufacturing an image device, the method comprising the steps of:
    forming a first color filter having a first melting temperature and a first height on a pixel array substrate;
    forming a second color filter member on the pixel array substrate spaced apart from the first color filter by a first interval, in which the second color filter member has a second melting temperature lower than the first melting temperature and a second height higher than the first color filter;
    forming a second color filter by selectively melting the second color filter member at the second melting temperature, in which the second color filter makes contact with the first color filter and has the first height;
    forming a third color filter member on the pixel array substrate spaced apart from the second color filter by a second interval, in which the third color filter member has a third melting temperature lower than the second melting temperature and a third height higher than the second color filter member;
    forming a third color filter by selectively melting the third color filter member at the third melting temperature, in which the third color filter makes contact with the second color filter and has the first height; and
    forming micro lenses formed on the first to third color filters.

13. The method as claimed in claim 12, wherein the first to third melting temperatures correspond to 120° C. to 140° C.

14. The method as claimed in claim 12, wherein the second and third heights are proportional to the first and second intervals.

15. The method as claimed in claim 7, wherein the first to third temperatures correspond to 120° C. to 140° C.

16. The method as claimed in claim 7, wherein the step of forming the first color filter comprises:
    forming a first color filter layer on the pixel array substrate;
    forming a first preliminary color filter by patterning the first color filter layer; and
    hardening the first preliminary color filter.

* * * * *